(12) United States Patent
Oh

(10) Patent No.: US 7,341,940 B2
(45) Date of Patent: Mar. 11, 2008

(54) METHOD FOR FORMING METAL WIRINGS OF SEMICONDUCTOR DEVICE

(75) Inventor: Su Jin Oh, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 160 days.

(21) Appl. No.: 11/024,476

(22) Filed: Dec. 30, 2004

(65) Prior Publication Data
US 2005/0142849 A1 Jun. 30, 2005

(30) Foreign Application Priority Data
Dec. 31, 2003 (KR) .................. 10-2003-0101825

(51) Int. Cl.
*H01L 21/4763* (2006.01)
(52) U.S. Cl. ................... 438/637; 438/638
(58) Field of Classification Search .............. 438/637
See application file for complete search history.

(56) References Cited
U.S. PATENT DOCUMENTS 6,652,718 B1 * 11/2003 D'Couto et al. ......... 204/192.3
6,713,402 B2 * 3/2004 Smith et al. ............. 438/710
7,088,003 B2 * 8/2006 Gates et al. ............. 257/774
2004/0229462 A1 * 11/2004 Gracias et al. .......... 438/689

\* cited by examiner

*Primary Examiner*—Thao P. Le
(74) *Attorney, Agent, or Firm*—Lowe Hauptman Ham & Berner LLP

(57) ABSTRACT

A method of forming metal wirings for a semiconductor device. A first etch stop layer, an dielectric layer, a second etch stop layer, and a wiring layer are deposited on a semiconductor substrate. A hole is formed by etching the wiring layer, the first etch stop layer, and the dielectric layer. A trench is formed by etching the wiring layer. The exposed first and second etch stop layers are removed after removal of the trench pattern. A barrier metal layer is deposited on inner walls of the hole and the trench. Grooves are formed on the barrier metal layer. A metal seed layer is deposited on the barrier metal layer. A metal thin layer is deposited inside the hole and the trench. The metal thin layer, the metal seed layer, and the barrier metal layer on the wiring layer are removed.

14 Claims, 4 Drawing Sheets

METHOD FOR FORMING METAL WIRINGS OF SEMICONDUCTOR DEVICE

CROSS-REFERENCE TO RELATED APPLICATION

This application claims the benefit of Korea Patent Application No. 10-2003-0101825, filed Dec. 31, 2003, the contents of which are hereby incorporated herein by reference in their entirety.

BACKGROUND OF THE INVENTION (a) Field of the Invention

The present invention relates to a method of forming metal wirings for a semiconductor device, and more specifically to forming the metal wirings through a dual damascene process.

(b) Discussion of the Related Art

Typically, in a semiconductor metal wirings are formed from conductive material, such as aluminum, aluminum alloy, copper, or the like. The metal wirings electrically connect the semiconductor devices and pads on a semiconductor substrate.

In order to connect electrodes and pads isolated by dielectric layers formed from oxide, contact holes are formed by selectively etching the dielectric layers. Metal plugs, formed from a barrier metal and tungsten, are used to fill the holes. The metal wirings for contacting the electrodes and the pads are formed by depositing and patterning a metal thin layer.

In order to patterning the metal wirings, a photolithography process is used. As semiconductor devices become more highly integrated, critical dimensions of the metal wirings become more narrow, and it becomes more difficult to form the fine pattern metal wirings.

A dual damascene process is used in an attempt to overcome these problems. In the dual damascene process, a metal wiring layer is patterned by forming a tungsten plug in the contact hole of the dielectric layer, depositing an upper dielectric layer (such as oxide layer) on the dielectric layer, removing the upper dielectric layer on the area at which the metal wiring pattern is formed, depositing a metal thin layer thereon, and planarizing the metal thin layer.

Recently, a dual damascene process has been developed for forming the metal wirings which contact a low conductive layer without forming the metal plug. In this dual damascene process, the contact hole and a trench are formed by sequentially depositing an etch stop layer and a dielectric layer. An etching process is used to selectivity etch the etch stop layer and the dielectric layer. A barrier metal is deposited inside the contact hole and the trench to form the metal wirings, which are formed from copper, for example.

However, this dual damascene technique suffers from disadvantages including that the copper wiring is cracked or detached after the subsequent processes are performed, such as during CMP (chemical mechanical polishing) due to stresses between a fluorine silicate glass (FSG) in the dielectric layer and the copper wirings, as well as because of defective adhesion between the copper wirings and the barrier metal. As a result, a yield of usable semiconductor devices is decreased.

SUMMARY OF THE INVENTION

To address the above-described and other problems, it is an object of the present invention to provide a method of forming metal wirings for a semiconductor device. A first etch stop layer, an dielectric layer, a second etch stop layer, and a wiring layer are deposited on a semiconductor substrate. A hole pattern is formed on the wiring layer. A hole is formed by etching the wiring layer, the first etch stop layer, and the dielectric layer exposed through the pattern. A trench pattern is formed on the wiring layer after removal of the hole pattern. A trench is formed by etching the wiring layer exposed through the trench pattern. The exposed first and second etch stop layers are removed after removal of the trench pattern. A barrier metal layer is deposited on inner walls of the hole and the trench. Grooves are formed on the barrier metal layer through a sputtering process. A metal seed layer is deposited on the barrier metal layer. A metal thin layer is deposited inside the hole and the trench. The metal thin layer, the metal seed layer, and the barrier metal layer on the wiring layer are removed through a chemical metal polishing process.

It is to be understood that both the foregoing general description of the invention and the following detailed description are exemplary, but are not restrictive of the invention.

BRIEF DESCRIPTION OF THE DRAWINGS

The accompanying drawings, which are included to provide a further understanding of the invention and are incorporated in and constitute a part of this application, illustrate aspects of the invention and together with the description serve to explain the principle of the invention.

DETAILED DESCRIPTION OF THE INVENTION

Figure 1:
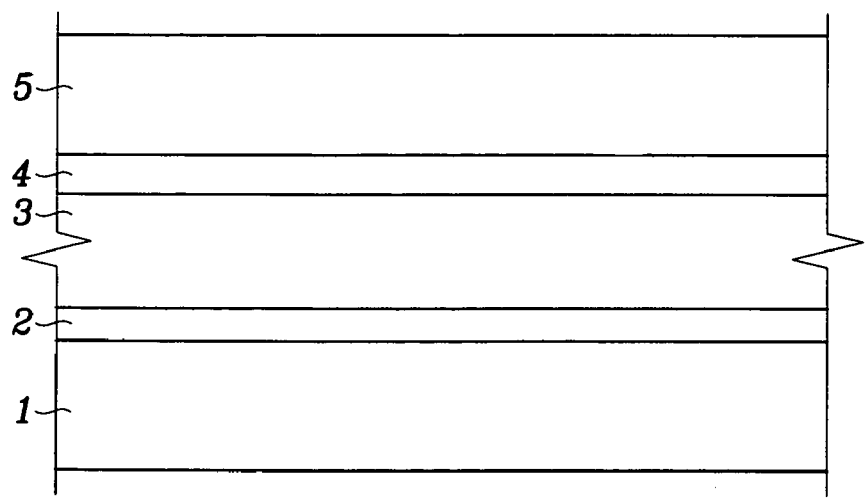
FIGS. 1-7 are cross-sectional views illustrating a method of forming metal wirings for a semiconductor device.

With reference to the accompanying drawings, the present invention is now described. It is to be understood, however, that the invention is not limited to the disclosed embodiments, but rather includes various modifications and arrangements within the scope of the claims.

To clarify multiple layers and regions, thickness of the layers are enlarged in the drawings. The same reference numbers are used throughout the drawings to refer to the same or similar parts. When a part such as a layer, film, area, or plate is described as positioned on another part, it is to be understood that the part can be disposed directly in contact with the other part or above the other part with at least one intermediate part disposed therebetween.

FIGS. 1-7 are cross-sectional views illustrating a method of forming metal wirings for a semiconductor device.

As shown in FIG. 1, a first etch stop layer 2 is formed. The first etch stop layer 2 prevents a semiconductor substrate 1, which has device electrodes and a thin dielectric layer, from reacting with metal wirings. An inter metal dielectric layer 3 is deposited on the first etch stop layer 2, and a second etch stop layer 4 is formed on the inter metal dielectric layer 3. The first etch stop layer 2 is used as an etch stop point while etching the interlayer dielectric layer 3. A wiring dielectric layer 5 is deposited on the second etch stop layer 4 to form a metal wiring layer. The second etch stop layer 4 is used as an etch stop point while etching the wiring dielectric layer 5. Preferably, the first and second etch stop layers 2 and 4 are formed from silicon nitride (SiN) using a plasma enhanced chemical vapor deposition (PECVD) process.

Figure 2:
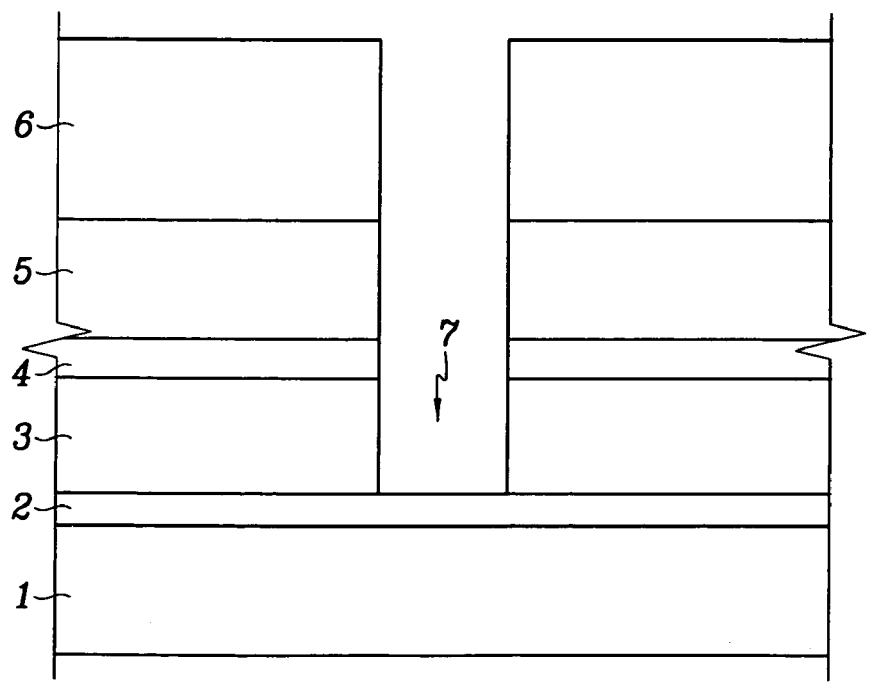

As shown in FIG. 2, a contact hole 7 is formed on the inter metal dielectric layer 3 by depositing a contact hole pattern 6 on the wiring dielectric layer 5. The contact hole pattern 6 is used as a mask during etching to remove exposed portions of the wiring dielectric layer 5, the second etch stop layer 4, and the inter metal dielectric layer 3. An example of a suitable etching technique includes dry etching.

Figure 3:
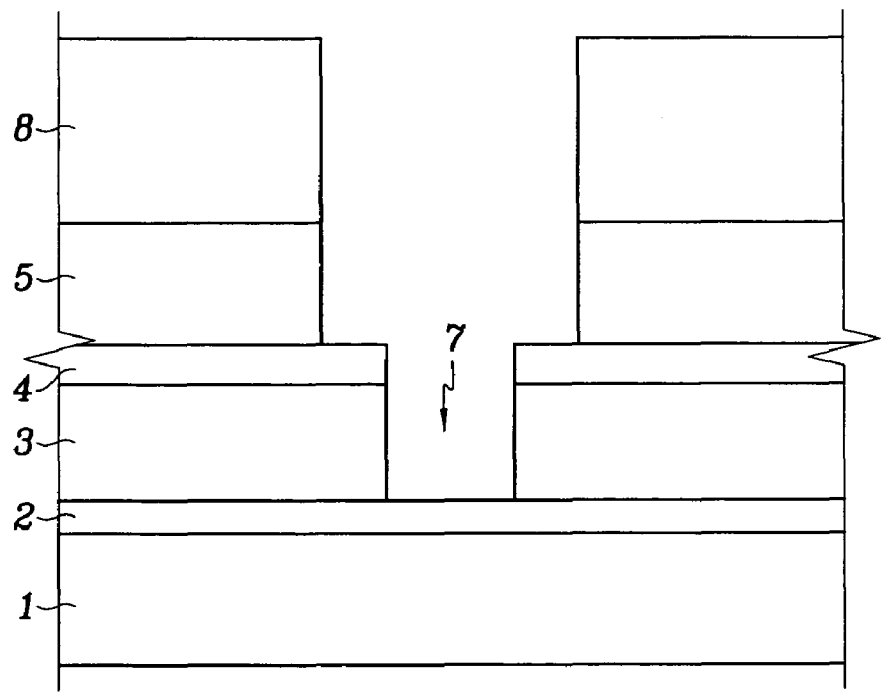

As shown in FIG. 3, the contact hole pattern 6 is removed, and a trench pattern 8 is formed on the wiring dielectric layer 5. The trench pattern 8 is used as a mask during etching to remove an exposed portion of the wiring dielectric 5 layer. By this process, a trench is formed. The second etch stop layer 4 prevents an upper surface of the inter metal dielectric layer 3 from being etched. Specifically, because the second etch stop layer 4 is deposited on the inter metal dielectric layer 3, it is possible to prevent the inter metal dielectric layer 3 from being etched while etching the wiring dielectric layer 5.

Figure 4:
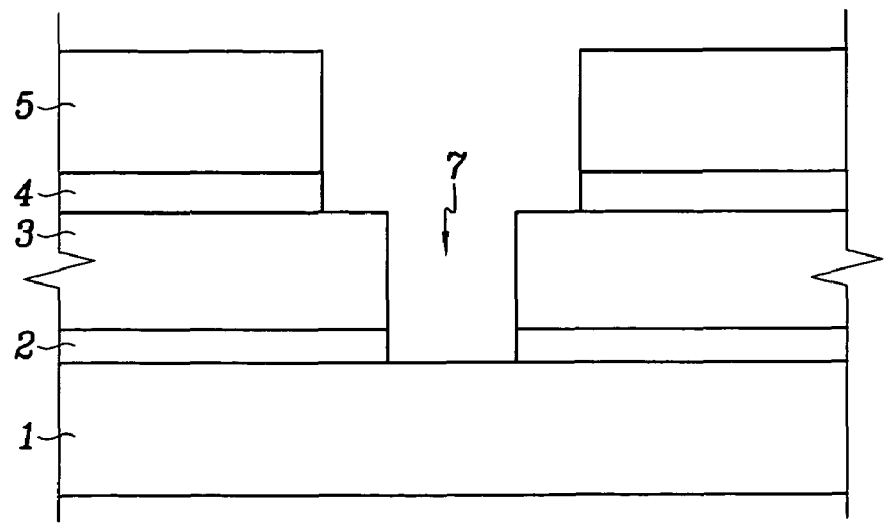

As shown in FIG. 4, the trench pattern 8 on the wiring dielectric 5 is removed, and the wiring dielectric layer 5 is etched. Exposed portions of the first etch stop layer 2 and the second stop etch layer 4 are etched and removed. Since the first and second etch stop layer 2 and 4 are dielectric layers and allow current to flow from metal wirings to conductive layers of the semiconductor substrate 1, removal of portions of the first and second etch stop layer 2 and 4 can be used to obtain a required dielectric capacitance.

Figure 5:
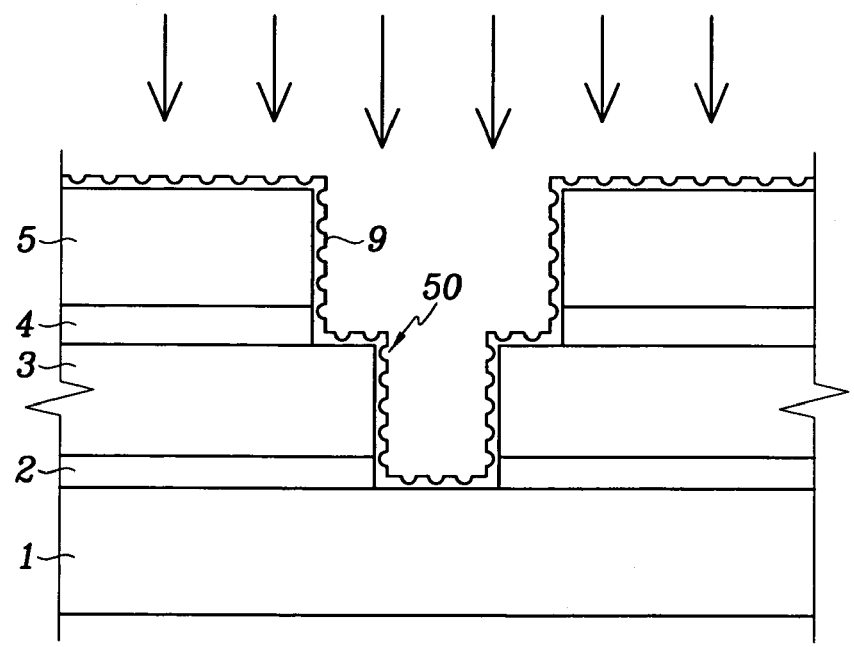

As shown in FIG. 5, a barrier metal layer 9 is deposited on an entire surface of the semiconductor substrate 1. The barrier metal layer 9 prevents reaction of a metal thin layer and a conductive layer below the thin layer of the semiconductor substrate 1 before the metal thin layer has been deposited. Preferably, the barrier metal layer 9 is formed from one or more of Ta, TaN, Ti, TiN, and WN.

A plurality of grooves 50 are formed on the barrier metal layer 9. The grooves 50 are formed to enhance an adhesion force between the barrier metal layer 9 and a metal seed layer 10 and a metal thin layer 11. Preferably, the grooves 50 are formed through a sputtering process, and/or plasma bombardment by applying a low voltage RF power with a nonvolatile gas, including one or more of $N_2$, He, Ne, or Ar on the surface of the barrier metal layer 9. By this process, nano-size fine grooves 50 are formed on the surface of the barrier metal layer 9. The grooves 50 increase the roughness of the barrier metal layer 9 and increase the reaction surface in the metal seed layer 10 formation and electro copper plating (ECP) processes, and enhance the adhesion force between the barrier metal layer 9 and the metal seed layer 10. The sputtering process is preferably performed with an electric source having a high frequency of about 13.56 MHz, about 100 Hz, or about 1 MHz. The sputtering process is preferably performed with a plasma generation power source from about 0 KW to about 1 KW, a substrate bias from about 1 W to about 500 W, and/or a pressure from about 0.5 mTorr to about 5 mTorr.

The grooves 50 can be uniformly formed on the barrier metal layer 9 by applying a gas including $N_2$ with a volumetric flow rate from about 0 sccm to about 5000 sccm, with a mixture gas including one or more nonvolatile gases, such as He, Ne, and Ar.

Figure 6:
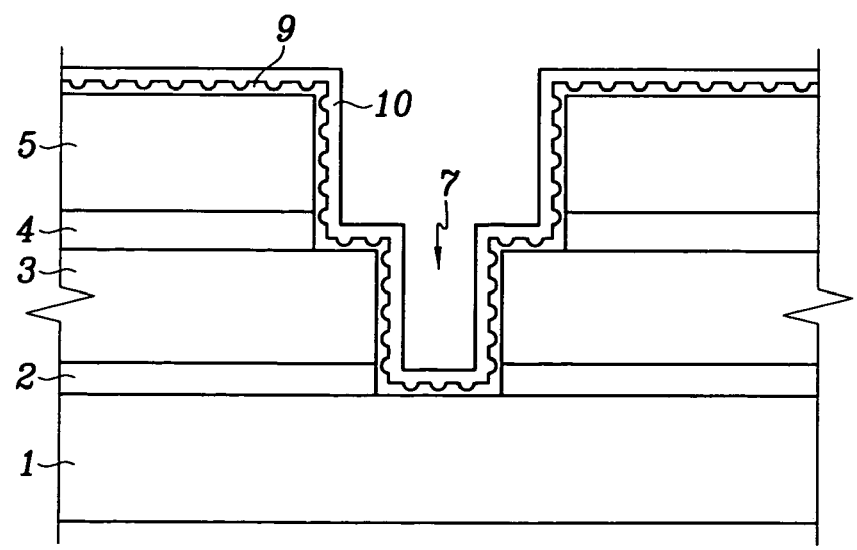

The contact hole 7 formed in the inter metal dielectric layer 3, as well as the trench formed in the wiring dielectric layer 5, is filled with the electroplating process deposition (EPD) metal thin layer having superior throughput and filling characteristics. Metal ions are moved to the surface of the thin layer and the electrons are provided in sufficient numbers so as to deoxidize to the metal, such that the EPD metal thin layer is developed on the surface of the thin layer. Since the barrier metal layer 9 has a high resistivity, the metal seed layer 10 is deposited on the barrier metal layer 9 at the thickness of several hundred angstroms (Å) through a chemical vapor deposition (CVD) technique. By this process, sufficient numbers of electrons are provided on the surface of the thin layer in EDP metal thin layer deposition process, as shown in FIG. 6.

Figure 7:
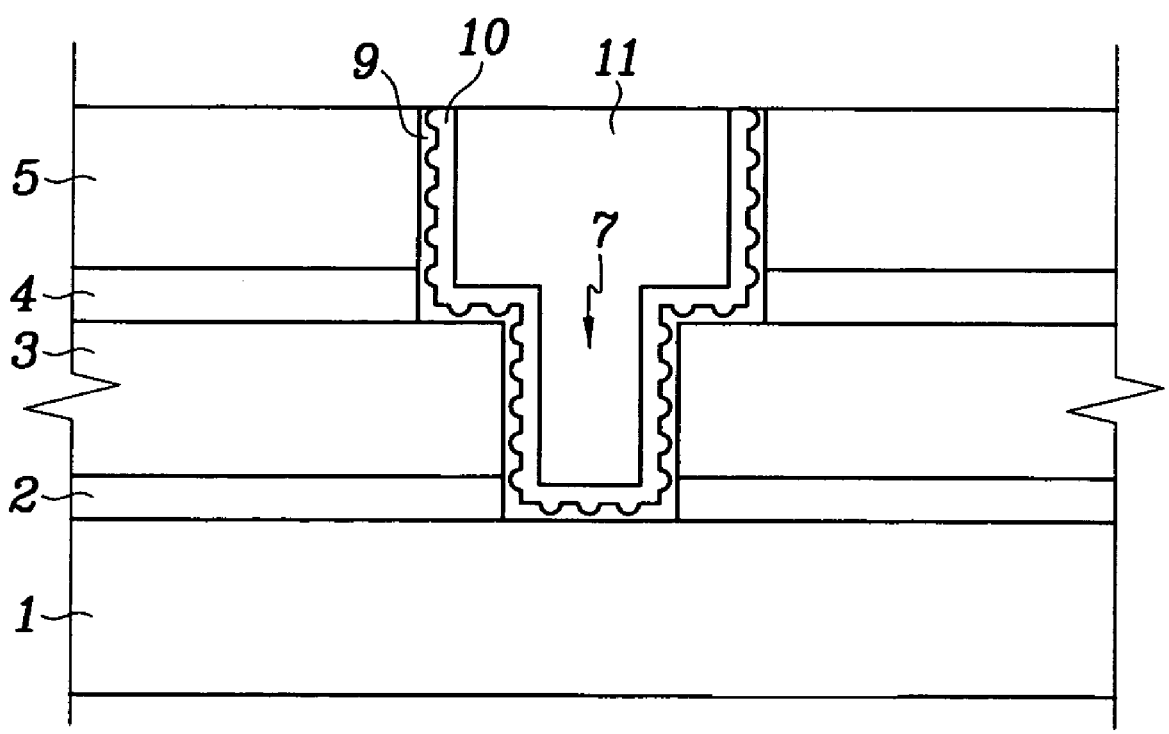

As shown in FIG. 7, the metal thin layer 11 is filled within the contact hole 7 of the inter metal dielectric layer 3 and the trench of the wiring dielectric layer 5 through the EPD process. The portions of the metal thin layer 11 on the wiring dielectric layer 5, the metal seed layer 10, and the barrier metal layer 9 are polished through a CMP (chemical mechanical polishing) process. By this process, the metal wirings are formed on the semiconductor device. Preferably, the metal wirings and metal seed layer 10 are formed from copper.

The grooves 50 are formed on the barrier metal layer 9 in the single damascene process forming the first etch stop layer 2, such that the adhesion force between the barrier metal layer 9 and the metal thin layer 11 is enhanced.

Also, the grooves 50 formed on the barrier metal layer 9 reduce a floating effect of the metal wirings occurring by friction in subsequent processes, such as the CMP process. Therefore, it is possible to improve the electrical characteristic of the semiconductor device.

Korean Patent Application no. 10-2003-0101825, filed on Dec. 31, 2004, is incorporated by reference herein in its entirety.

Although preferred embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method of forming metal wirings for a semiconductor device, comprising:
   depositing a first etch stop layer, an inter metal dielectric layer, a second-etch stop layer, and a wiring dielectric layer on a semiconductor substrate having a predetermined structure;
   forming a contact hole pattern on the wiring dielectric layer;
   forming a contact hole by etching the wiring dielectric layer, the second etch stop layer, and the inter metal dielectric layer exposed through the contact hole pattern;
   forming a trench pattern on the wiring dielectric layer after removal of the contact hole pattern;
   forming a trench by etching the wiring dielectric layer exposed through the trench pattern;
   removing the exposed first and second etch stop layers after removal of the trench pattern;
   depositing a barrier metal layer on inner walls of the contact hole and the trench;
   forming grooves on the barrier metal layer through a sputtering process;
   depositing a metal seed layer on the barrier metal layer;
   depositing a metal thin layer inside the contact hole and the trench; and
   removing the metal thin layer, the metal seed layer, and the barrier metal layer on the wiring dielectric layer through a chemical mechanical polishing process.

2. The method according to claim 1, wherein the step of depositing a barrier metal layer uses at least one of Ta, TaN, Ti, TiN, and WN.

3. The method according to claim 1, wherein the steps of depositing a metal thin layer and a metal seed layer use copper.

4. The method according to claim 1, wherein the step of forming grooves includes performing the sputtering process with a plasma generation voltage from about 0 KW to about 1 KW, and a bias voltage from about 1 W to about 500 W.

5. The method according to claim 4, wherein the step of forming grooves includes performing the sputtering process at a pressure from about 0.5 mTorr to about 5 mTorr through an application of $N_2$ at a volumetric flow rate from about 0 sccm to about 5000 sccm.

6. The method according to claim 5, wherein the step of forming grooves includes performing the sputtering process with a mixture gas of $N_2$ and a nonvolatile gas.

7. The method according to claim 6, wherein the step of forming grooves includes performing the sputtering process with the nonvolatile gas including one or more of He, Ne, and Ar.

8. A method of forming metal wirings for a semiconductor device, comprising:
   step for depositing a first etch stop layer, an inter metal dielectric layer, a second etch stop layer, and a wiring dielectric layer on a semiconductor substrate having a predetermined structure;
   step for forming a contact hole pattern on the wiring dielectric layer;
   step for forming a contact hole by etching the wiring dielectric layer, the second etch stop layer, and the inter metal dielectric layer exposed through the contact hole pattern;
   step for forming a trench pattern on the wiring dielectric layer after removal of the contact hole pattern;
   step for forming a trench by etching the wiring dielectric layer exposed through the trench pattern;
   step for removing the exposed first and second etch stop layers after removal of the trench pattern;
   step for depositing a barrier metal layer on inner walls of the contact hole and the trench;
   step for forming grooves on the barrier metal layer through a sputtering process;
   step for depositing a metal seed layer on the barrier metal layer;
   step for depositing a metal thin layer inside the contact hole and the trench; and
   step for removing the metal thin layer, the metal seed layer, and the barrier metal layer on the wiring dielectric layer through a chemical mechanical polishing process.

9. The method according to claim 8, wherein the step for depositing a barrier metal layer uses at least one of Ta, TaN, Ti, TiN, and WN.

10. The method according to claim 8, wherein the steps for depositing a metal thin layer and a metal seed layer use copper.

11. The method according to claim 8, wherein the step for forming grooves includes performing the sputtering process with a plasma generation voltage from about 0 KW to about 1 KW, and a bias voltage from about 1 W to about 500 W.

12. The method according to claim 11, wherein the step for forming grooves includes performing the sputtering process at a pressure from about 0.5 mTorr to about 5 mTorr through an application of $N_2$ at a volumetric flow rate from about 0 sccm to about 5000 sccm.

13. The method according to claim 12, wherein the step for forming grooves includes performing the sputtering process with a mixture gas of $N_2$ and a nonvolatile gas.

14. The method according to claim 7, wherein the step for forming grooves includes performing the sputtering process with the nonvolatile gas including one or more of He, Ne, and Ar.

* * * * *